(12) United States Patent
Sakai et al.

(10) Patent No.: US 8,466,372 B2
(45) Date of Patent: Jun. 18, 2013

(54) WIRING BOARD WITH BUILT-IN ELECTRONIC COMPONENT AND METHOD FOR MANUFACTURING THE SAME

(75) Inventors: Shunsuke Sakai, Ogaki (JP); Kenji Sato, Ogaki (JP); Toshiki Furutani, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 450 days.

(21) Appl. No.: 12/555,438

(22) Filed: Sep. 8, 2009

(65) Prior Publication Data

US 2010/0078205 A1    Apr. 1, 2010

Related U.S. Application Data

(60) Provisional application No. 61/101,286, filed on Sep. 30, 2008.

(51) Int. Cl.
   *H05K 1/16* (2006.01)
(52) U.S. Cl.
   USPC .................................................. 174/260
(58) Field of Classification Search
   USPC ............... 174/260, 255, 261; 361/729, 736, 361/748, 749, 750, 761, 767, 784, 792, 799, 361/807, 810
   See application file for complete search history.

(56) References Cited

U.S. PATENT DOCUMENTS

| | | | |
|---|---|---|---|
| 5,353,195 | A | 10/1994 | Fillion et al. |
| 6,876,554 | B1 | 4/2005 | Inagaki et al. |
| 2005/0157478 | A1 | 7/2005 | Inagaki et al. |
| 2008/0041619 | A1 | 2/2008 | Lee et al. |
| 2008/0055872 | A1 | 3/2008 | Inagaki et al. |
| 2008/0115349 | A1 | 5/2008 | Kim et al. |
| 2008/0158838 | A1 | 7/2008 | Inagaki et al. |
| 2008/0158841 | A1 | 7/2008 | Inagaki et al. |

FOREIGN PATENT DOCUMENTS

| | | |
|---|---|---|
| JP | 2000-174442 | 6/2000 |
| JP | 2002-100876 | 4/2002 |
| JP | 2002-204071 | 7/2002 |
| JP | 2002-237683 | 8/2002 |
| JP | 2002-246757 | 8/2002 |
| JP | 2003-309243 | 10/2003 |
| JP | 2007-288109 | 11/2007 |
| JP | 2008-047917 | 2/2008 |
| JP | 2008-131039 | 6/2008 |
| KR | 10-2006-0069086 | 6/2006 |
| KR | 10-0773985 | 11/2007 |
| KR | 10-0788213 | 12/2007 |
| KR | 10-0820633 | 4/2008 |

OTHER PUBLICATIONS

U.S. Appl. No. 12/566,731, filed Sep. 25, 2009, Sato, et al.

*Primary Examiner* — Jeremy Norris
*Assistant Examiner* — Tremesha S Willis
(74) *Attorney, Agent, or Firm* — Oblon, Spivak, McClelland, Maier & Neustadt, L.L.P.

(57) ABSTRACT

A wiring board with a built-in electronic component includes a core substrate having a penetrating hole formed in the core substrate, an electronic component accommodated in the penetrating hole in the core substrate, a conductive pattern layer formed on a first surface of the core substrate and including a first conductive pattern and a second conductive pattern, and an interlayer insulation layer formed over the conductive pattern layer and the first surface of the core substrate. The second conductive pattern is formed adjacent to a periphery of the penetrating hole and contoured such that a sheet for positioning the electronic component in the penetrating hole is laminated horizontally with respect to the first surface of the core substrate over the penetrating hole.

16 Claims, 14 Drawing Sheets

- - - Outline of the mounting surface of an electronic component

- - - Outline of the penetrating hole to be formed

Outline of the penetrating hole

WIRING BOARD WITH BUILT-IN ELECTRONIC COMPONENT AND METHOD FOR MANUFACTURING THE SAME

CROSS-REFERENCE TO RELATED APPLICATIONS

The present application claims the benefits of priority to U.S. Application No. 61/101,286, filed Sep. 30, 2008. The contents of that application are incorporated herein by reference in their entirety.

BACKGROUND OF THE INVENTION

1. Field of the Invention

The present invention is related to a wiring board with a built-in electronic component in which an electronic component such as a semiconductor element is accommodated.

2. Discussion of the Background

In recent years, electronic devices have become more highly functional and compact. Accordingly, wiring boards mounted inside such electronic devices are further required to be highly functional and highly integrated.

For example, in Japanese Patent Laid-Open Publication 2002-246757, a method for manufacturing a multilayer printed wiring board is described as follows: a step to laminate a sheet such as a UV tape on the bottom of a penetrating hole formed in a core substrate; a step to mount a semiconductor element such as an IC chip on the sheet in such a way that its terminals contact the adhesive surface of the sheet; a step to fill resin in the penetrating hole; a step to cure the filled resin; a step to remove the sheet; and a step to form build-up layers on the top surface of the semiconductor element.

As shown in FIG. 13A, the UV tape or the like may likely warp. Furthermore, if the laminated UV tape or the like is warped, sealing on the bottom side becomes incomplete. Accordingly, as shown in FIG. 13B, filling resin may seep into the gaps between the core substrate and the UV tape or the like. The contents of this publication are incorporated herein by reference in their entirety.

SUMMARY OF THE INVENTION

According to one aspect of the present invention, a wiring board with a built-in electronic component includes a core substrate having a penetrating hole formed in the core substrate, an electronic component accommodated in the penetrating hole in the core substrate, a conductive pattern layer formed on a first surface of the core substrate and including a first conductive pattern and a second conductive pattern, and an interlayer insulation layer formed over the conductive pattern layer and the first surface of the core substrate. The second conductive pattern is formed adjacent to a periphery of the penetrating hole and contoured to laminate a sheet for positioning the electronic component in the penetrating hole horizontally with respect to the first surface of the core substrate over the penetrating hole.

According to another aspect of the present invention, a method for manufacturing a wiring board with a built-in electronic component includes forming a penetrating hole which accommodates an electronic component in a core substrate, forming a conductive pattern layer having a first conductive pattern and a second conductive pattern on one surface of the core substrate such that the second conductive pattern is formed adjacent to a periphery of the penetrating hole and contoured to laminate a sheet for positioning the electronic component in the penetrating hole horizontally with respect to the first surface of the core substrate over the penetrating hole, laminating the adhesive tape over the surface of the core substrate, mounting the electronic component on the adhesive tape forming the bottom of the penetrating hole, filling a resin material in a gap between the electronic component and the core substrate to secure the electronic component in the penetrating hole, and removing the adhesive tape after the electronic component is secured.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
FIG. 1A is a cross-sectional view of a copper-clad laminate to be used in the present embodiment.

The embodiments will now be described with reference to the accompanying drawings, wherein like reference numerals designate corresponding or identical elements throughout the various drawings.

Figure 5:
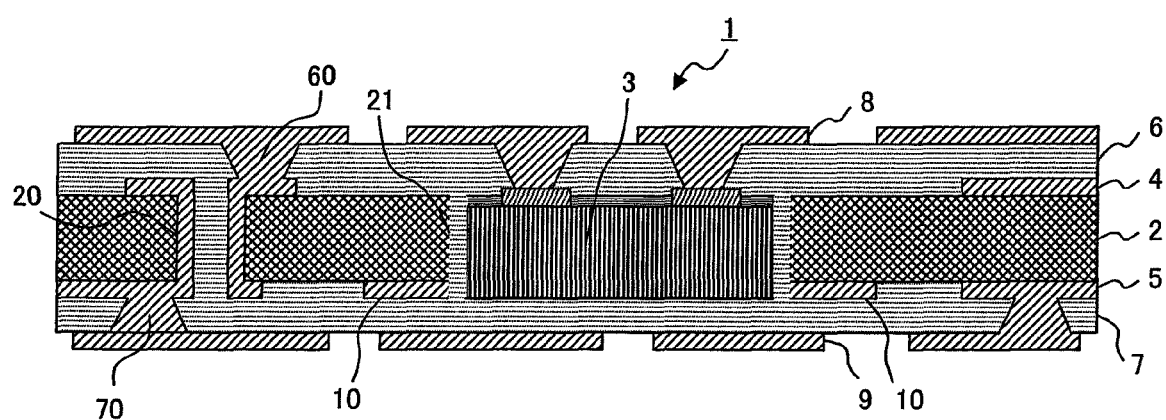
FIG. 5 is a cross-sectional view of a wiring board with a built-in electronic component according to an embodiment of the present invention.

FIG. 5 is a cross-sectional view schematically showing substrate 1 with a built-in electronic component manufactured according to a manufacturing method of Embodiment 1. Substrate 1 with a built-in electronic component has core substrate 2, electronic component 3 accommodated (built in) in core substrate 2, conductive patterns 4, 5 formed respectively on both main surfaces of core substrate 2, interlayer insulation layers 6, 7, conductive patterns 8, 9 formed respectively on interlayer insulation layers 6, 7, and conductive pattern 10 formed on one main surface of core substrate 2.

Core substrate 2 is a substrate made by impregnating reinforcing material (base material) with resin. Its thickness is approximately 110 μm. As for a reinforcing material, glass cloth, glass non-woven fabric, aramid non-woven fabric or the like may be used preferably. Other than those, any insulative material of equal strength may be used.

Also, as for the resin to be impregnated in the reinforcing material, epoxy resin, BT (bismaleimide triazine) resin, polyimide resin or the like may be employed.

Conductive patterns 4, 5 are made of copper or the like and their thicknesses are each approximately 20 μm. Conductive pattern 4 is formed on one main surface (hereinafter referred to as the first surface) of core substrate 2; and conductive pattern 5 is formed on the other main surface (hereinafter referred to as the second surface) of core substrate 2. Conductive pattern 4 and conductive pattern 5 are electrically connected by means of through-hole conductors 20.

Electronic component 3 is an IC chip in the present embodiment, and is accommodated in penetrating hole 21 of core substrate 2 in a so-called face-up position.

Interlayer insulation layers 6, 7 are formed with a plate made by impregnating reinforcing material such as glass fabric, aramid fabric or the like with resin such as epoxy resin, polyester resin, polyimide resin, BT resin, phenol resin or the like. In the present embodiment, all the plates are formed with prepreg. Interlayer insulation layer 6 is formed on the first surface of core substrate 2 and interlayer insulation layer 7 is formed on the second surface. Their thicknesses are each approximately 60 μm.

Conductive patterns 8, 9 are made of copper or the like and their thicknesses are each approximately 20 μm. Conductive pattern 8 is formed on interlayer insulation layer 6, and is electrically connected through via conductors 60 to conductive pattern 4 and terminals 30 of electronic component 3. On the other hand, conductive pattern 9 is formed on interlayer insulation layer 7 and is electrically connected through via conductors 70 to conductive pattern 9.

Conductive pattern 10 is formed on the second surface of core substrate 2 the same as in conductive pattern 5. Conductive pattern 10 is made of copper or the like and its thickness is approximately 20 μm. Conductive pattern 10 is used to precisely position electronic component 3 as described later in detail, and it is not electrically connected to other conductive patterns.

In the following, a method for manufacturing substrate 1 with a built-in electronic component is described with reference to FIGS. 1A-4B.

First, as shown in FIG. 1A, a copper-clad laminate is prepared in which copper foils 101, 102 with an approximate thickness of 12 μm are laminated on both main surfaces of core substrate 2 with an approximate thickness of 110 μm.

Figure 1B:
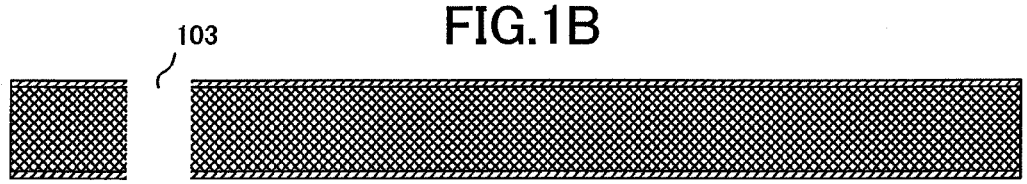
FIG. 1B is a cross-sectional view showing a phase in which a through-hole is formed in the substrate shown in FIG. 1A.

In the following, through-holes 103 are formed in the copper-clad laminate shown in FIG. 1A by a drilling method using a drill or the like (see FIG. 1B). Here, through-holes 103 may be formed using a carbon dioxide gas ($CO_2$) laser, Nd:YAG laser, excimer laser or the like.

Figure 1C:
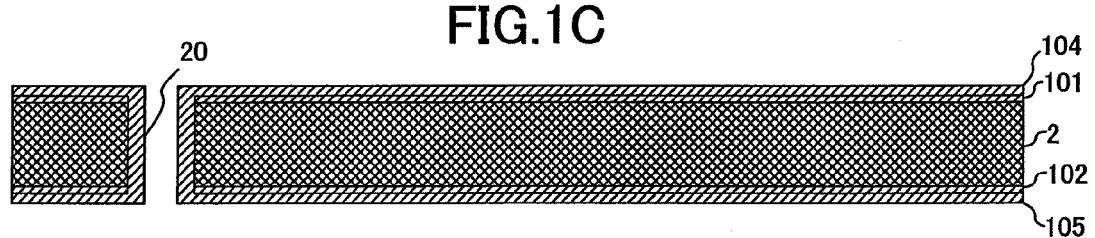
FIG. 1C is a cross-sectional view showing a phase after electroless copper plating and electrolytic copper plating were performed on the substrate shown in FIG. 1B.

In the following, a treatment (desmear treatment) is conducted to remove smearing or the like remaining on the inner surfaces of through-holes 103. Then, electroless copper plating and electrolytic copper plating are performed on the copper-clad laminate shown in FIG. 1B. Accordingly, as shown in FIG. 1C, copper-plated films 104, 105 are formed on both main surfaces of the copper-clad laminate shown in FIG. 1B along with through-hole conductors 20.

Figure 1D:
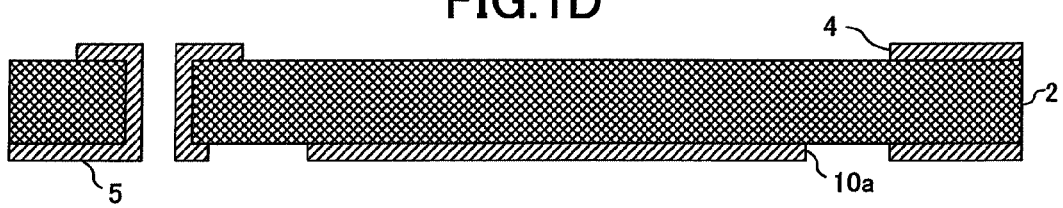
FIG. 1D is a cross-sectional view showing a phase in which a conductive pattern is formed on the core substrate.
Figure 4A:
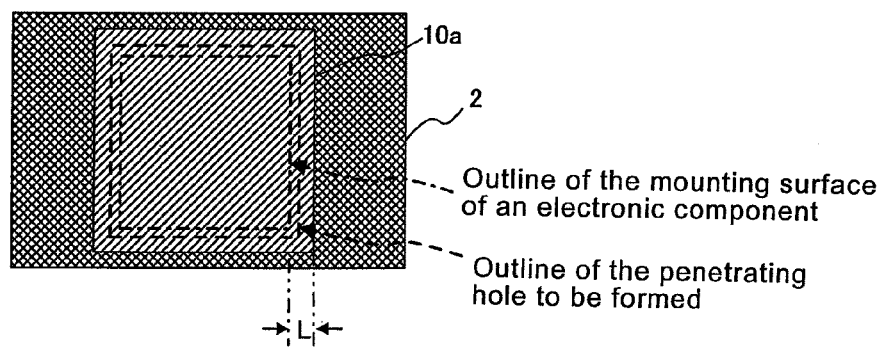
FIG. 4A is a plan view seen from the second-surface side of the substrate in FIG. 1D showing its essential part.

Then, using a subtractive method, unnecessary portions of copper-plated films 104, 105 are removed to form conductive patterns 4, 5, (10a) (see FIG. 1D). Conductive pattern (10a) is an original configuration (before drilling) of conductive pattern 10, and as shown in FIG. 4A, it is formed to be greater than the area of the mounting surface (namely, the area where the circuit is not formed) of electronic component 3. In the present embodiment, the size of conductive pattern (10a) is equal to the area in which the outline of the surface (rectangular) of electronic component 3 where the circuit is not formed is enlarged with a predetermined length (L) (approximately 50 μm).

Figure 1E:
FIG. 1E is a cross-sectional view showing a phase in which a penetrating hole is formed in the core substrate.
Figure 4B:
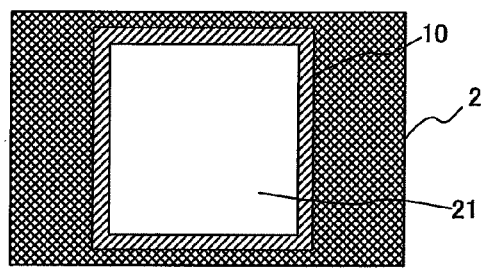
FIG. 4B is a plan view seen from the second-surface side of the substrate in FIG. 1E showing its essential part.

Next, by a drilling method using a drill or the like, penetrating hole 21 is formed to accommodate electronic component 3 (see FIG. 1E). Here, penetrating hole 21 may be formed using a carbon dioxide gas ($CO_2$) laser, Nd:YAG laser, excimer laser or the like. By drilling such a hole, conductive pattern 10 is formed. As shown in FIG. 4B, conductive pattern 10 is configured on the second surface of core substrate 2 to frame the end surface of penetrating hole 21 on the second-surface side without leaving gaps in between. The width of the frame which surrounds penetrating hole 21 is approximately 8.1 mm.

Figure 7:
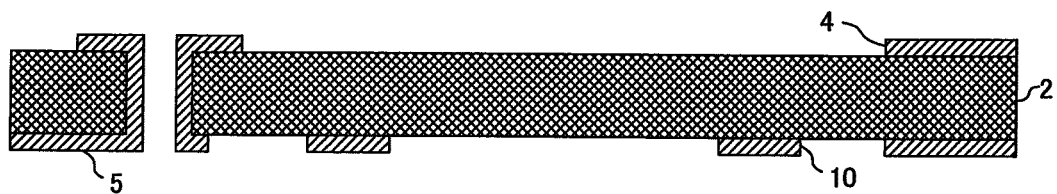
FIG. 7 is a cross-sectional view showing a phase in which a conductive pattern is formed on a core substrate in another embodiment.

As shown in FIG. 7, conductive pattern 10 may also be formed in advance before forming penetrating hole 21. In such a case, conductive pattern 10 is formed in the same process of forming conductive patterns 4, 5.

In the following, sheet or tape 201 is laminated on the second-surface side of the substrate shown in FIG. 1E (see FIG. 2A). As for tape 201, a UV tape (such as the Adwill D series, made by Lintec Corporation), whose adhesiveness is reduced through UV (ultraviolet) beaming to allow easy removal of the tape, may be used. Various adhesive tapes, for example, polyimide tapes or the like, whose adhesiveness is not reduced by high heat of over 80° C. during provisional curing, may also be used.

During that time, tape 201 may easily be laminated substantially horizontally without causing warping, since conductive pattern 10 exists there, which has the same thickness as that of conductive pattern 5 and is contoured or configured to frame the end surface of penetrating hole 21 on the second-surface side.

Figure 2A:
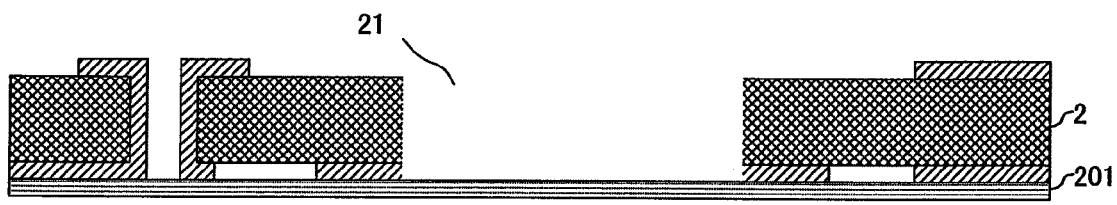
FIG. 2A is a cross-sectional view showing a phase in which a tape is laminated on the core substrate.
Figure 2B:
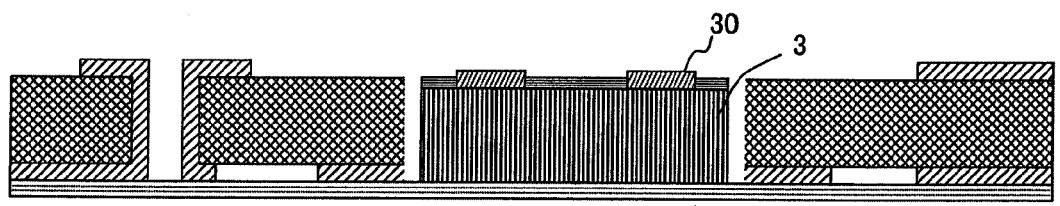
FIG. 2B is a cross-sectional view showing a phase in which an electronic component is mounted.

After tape 201 is laminated, electronic component 3 is mounted on its bonding (adhesive) surface in a so-called face-up position (see FIG. 2B). Here, as described above, since tape 201 is laminated substantially horizontally, electronic component 3 may be positioned precisely without being shifted vertically.

Figure 3A:
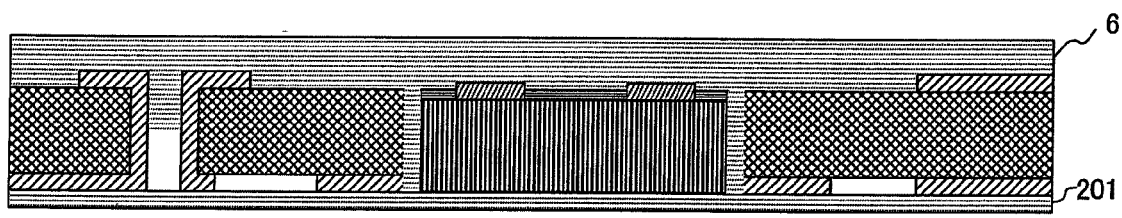
FIG. 3A is a cross-sectional view showing a phase in which an interlayer insulation layer is formed on the first surface of the core substrate.

In the following, on the first surface of the substrate shown in FIG. 2B, a resin film material (prepreg in the present embodiment) with an approximate thickness of 60 μm is laminated using a vacuum lamination method. As a result, as shown in FIG. 3A, interlayer insulation layer 6 is formed. During such lamination, the resin material flows into through-hole conductors 20, while flowing into the gaps in penetrating hole 21 between electronic component 3 and the inner walls of core substrate 2. Accordingly, the gaps between electronic component 3 and the inner walls of core substrate 2 are filled with the resin material.

As described above, conductive pattern 10 frames the end surface of penetrating hole 21 on the second-surface side without leaving gaps in between, and adheres to tape 201. Therefore, the resin material that flowed into the gaps between electronic component 3 and the inner walls of core substrate 2 will not flow out onto the second surface of core substrate 2, since pattern 10 works as a wall to block such flow.

Figure 3B:
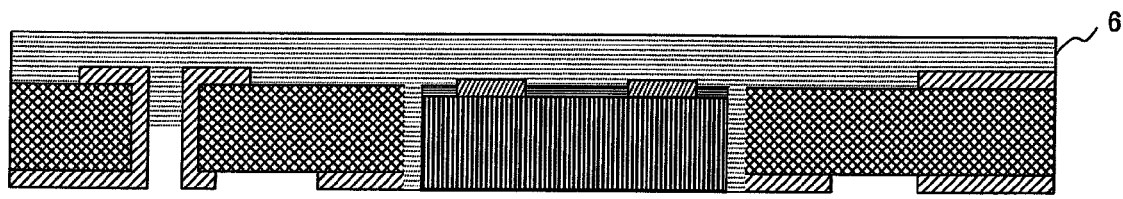
FIG. 3B is a cross-sectional view showing a phase after the tape was removed from the substrate shown in FIG. 3A.
Figure 3C:
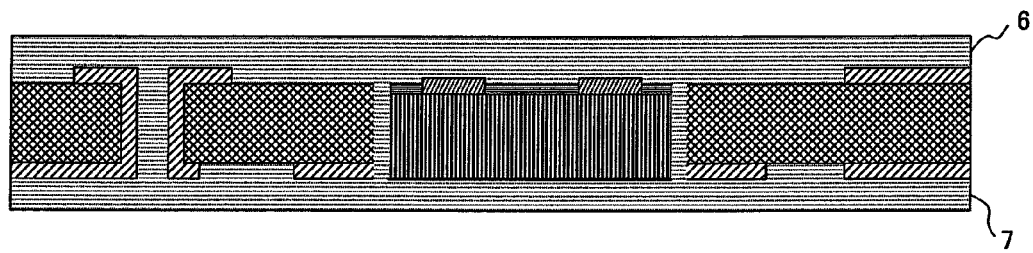
FIG. 3C is a cross-sectional view showing a phase in which an interlayer insulation layer is formed on the second surface of the core substrate.

In the following, UV rays are beamed and tape 201 is removed (see FIG. 3B). Then, a resin film material (prepreg in the present embodiment) with an approximate thickness of 60 μm is laminated on the second surface of the substrate shown in FIG. 3B using a vacuum lamination method. By doing so, as shown in FIG. 3C, interlayer insulation layer 7 is formed. During such lamination, the resin material flows into the interior of through-hole conductors 20, thus filling the interior of through-hole conductors 20 with resin material.

Figure 8A:
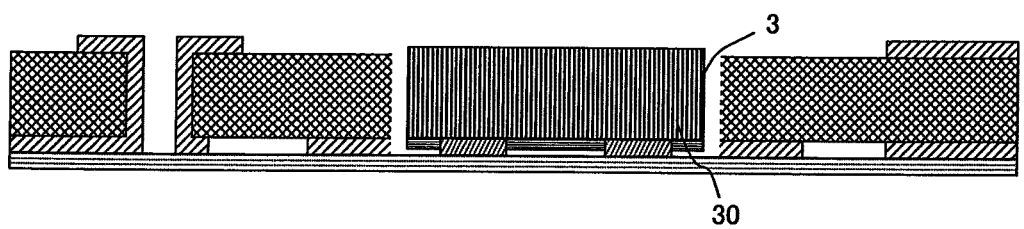
FIGS. 8A-8C are cross-sectional views showing an example in which an electronic component is accommodated in a face-down position.
Figure 8B:
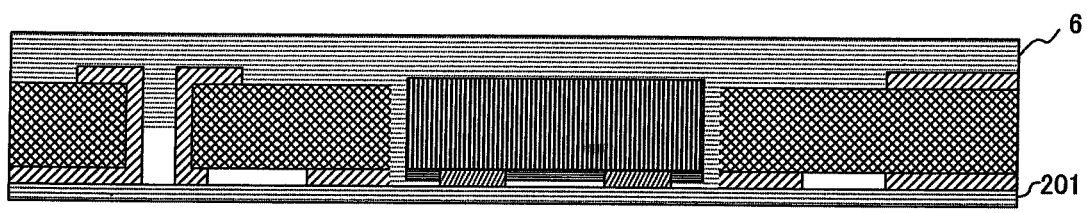
Figure 8C:
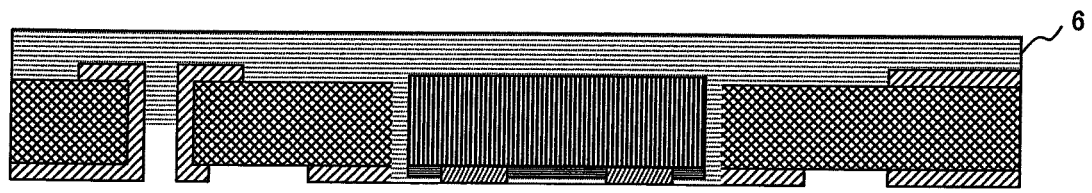

As shown in FIGS. 8A-8C, electronic component 3 may also be accommodated in a face-down position.

Next, using a carbon dioxide gas ($CO_2$) laser, UV-YAG laser or the like, via-holes are formed at predetermined spots of the substrate shown in FIG. 3C, and conductive patterns 8, 9 and via conductors 60, 70 are formed using an additive method. Accordingly, substrate 1 with a built-in electronic component is obtained as shown in FIG. 5.

As described, according to the manufacturing method of the present embodiment, conductive pattern 10 having the same thickness as conductive pattern 5 is formed on the second surface of core substrate 2 so as to frame the end surface of penetrating hole 21 on the second-surface side. Accordingly, tape 201 may easily be laminated substantially horizontally.

Then, since tape 201 is laminated substantially horizontally, electronic component 3 may be mounted in a substantially horizontal way at a predetermined position in penetrating hole 21. By doing so, the flatness of interlayer insulation layer 6 may be ensured. As a result, conductive pattern 8 may be formed finely on interlayer insulation layer 6 and via conductors 60 may also be formed precisely. Therefore, connection reliability between terminals 30 of electronic component 3 and via conductors 60 is enhanced.

Also, since conductive pattern 10 frames the end surface of penetrating hole 21 on the second-surface side without leaving gaps in between and thus forms walls, the resin material will not flow out onto the second surface of core substrate 2 during the lamination process. Therefore, the flatness of the top surface (where the circuit is formed) of accommodated electronic component 3 may further be ensured.

Figure 6:
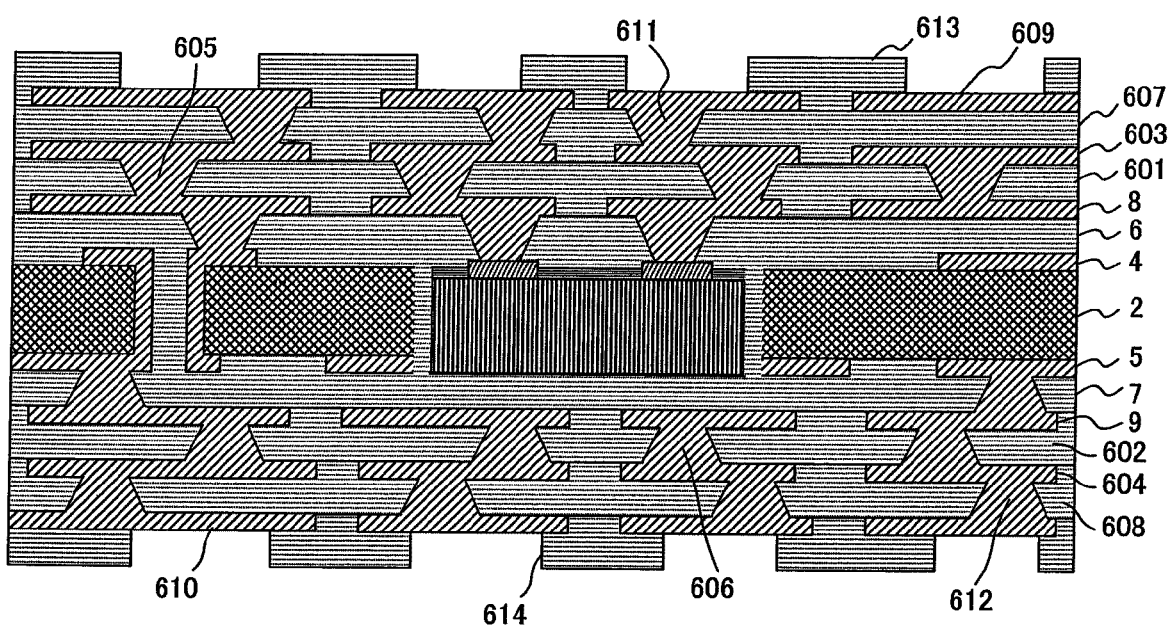
FIG. 6 is a cross-sectional view of a built-up multilayer printed wiring board using the substrate with a built-in electronic component shown in FIG. 5.

FIG. 6 shows an example of a built-up multilayer printed wiring board obtained by further building up multiple layers on substrate 1 with a built-in electronic component shown in FIG. 5. In the following, a method for manufacturing such a built-up multilayer printed wiring board is briefly described.

First, on the first and second surfaces of substrate 1 with a built-in electronic component, interlayer insulation layers 601, 602 are formed respectively. After that, opening portions are formed in interlayer insulation layers 601, 602 that reach conductive patterns 8, 9 formed in substrate 1 with a built-in electronic component.

Next, on interlayer insulation layers 601, 602, conductive patterns 603, 604 are formed respectively. During that time, via conductors 605, 606 are also formed respectively in the opening portions of interlayer insulation layers 601, 602. By doing so, conductive pattern 603 and conductive pattern 8 are electrically connected, and conductive pattern 604 and conductive pattern 9 are electrically connected.

In the same manner, interlayer insulation layers 607, 608, conductive patterns 609, 610 and via conductors 611, 612 are formed.

In the following, on both main surfaces of the substrate, a liquid or dry-film photosensitive resist (solder resist) is either applied or laminated. Then, a mask film with a predetermined pattern is adhered to the surface of the photosensitive resist, which is exposed to ultraviolet rays and developed in an alkaline solution.

As a result, solder-resist layers 613, 614 are formed where openings are arranged to expose portions of conductive patterns 609, 610 which are to become solder pads. Accordingly, the built-up multilayer printed wiring board is obtained as shown in FIG. 6.

The present invention is not limited to the above embodiment, but various modifications may be made within the scope of the present invention.

Figure 9A:
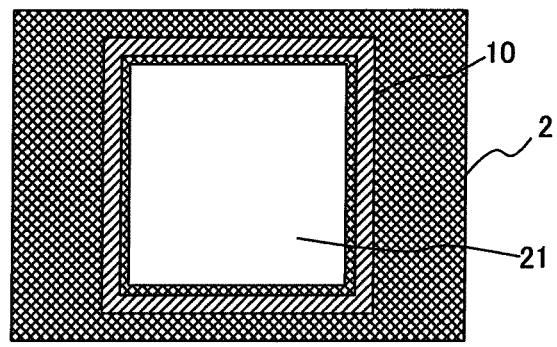
FIGS. 9A-9J are plan views to illustrate examples of dummy patterns in other embodiments.

For example, in the above embodiment, conductive pattern 10 is formed, as shown in FIG. 4B, to be made substantially flush with the outline of the end surface of penetrating hole 21 on the second-surface side. However, the present invention is not limited to such. For example, as shown in FIG. 9A, conductive pattern 10 may be formed while being slightly detached from the outline. In doing so, when forming interlayer insulation layer 6, part of the resin material forming interlayer insulation layer 6 may likely flow out of penetrating hole 21 and into the second surface of core substrate 2. However, since the resin material is blocked by conductive pattern 10, core substrate 2 will be filled with the resin material only to the wall of conductive pattern 10. Accordingly, the effect is to enhance adhesiveness between core substrate 2 and interlayer insulation layer 6. However, the distance detached from the outline is preferred to be made shorter than the line width (namely, the frame width) of conductive pattern 10.

Figure 9B:
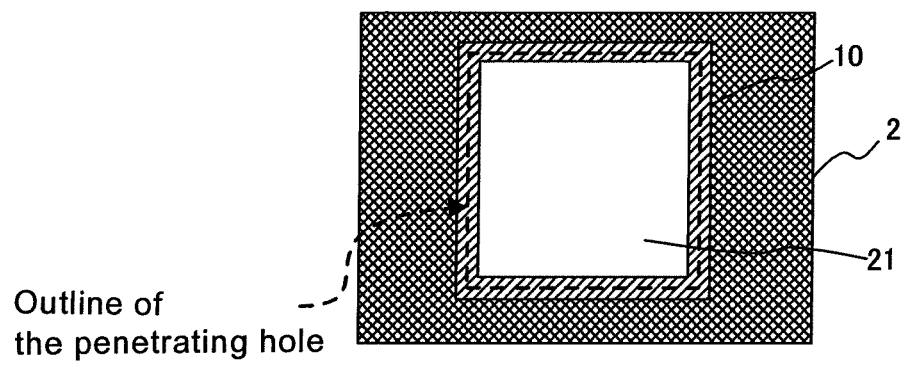

Alternatively, conductive pattern 10 may be formed to protrude slightly into the interior of penetrating hole 21 as shown in FIG. 9B. To configure conductive pattern 10 in such a way, a slightly complex process is needed, compared with the above embodiment. However, a process to laminate tape 201 substantially horizontally may be carried out even more easily.

Figure 9C:
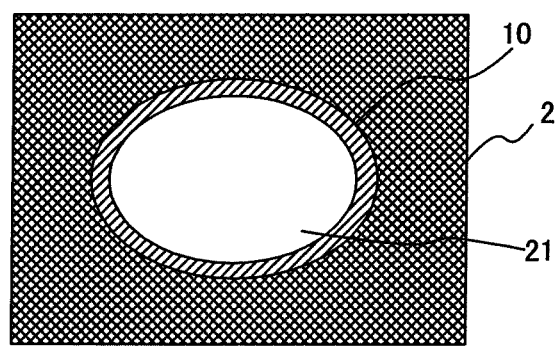

Also, in the above embodiment, the outline of the end surface of penetrating hole 21 was rectangular and the configuration of conductive pattern 10 was also rectangular. However, the configuration of the end surface of penetrating hole 21 or of conductive pattern 10 is not limited to such in the above embodiment. For example, as shown in FIG. 9C, the outline of the end surface of penetrating hole 21 and the outline of conductive pattern 10 may be oval.

Figure 9D:
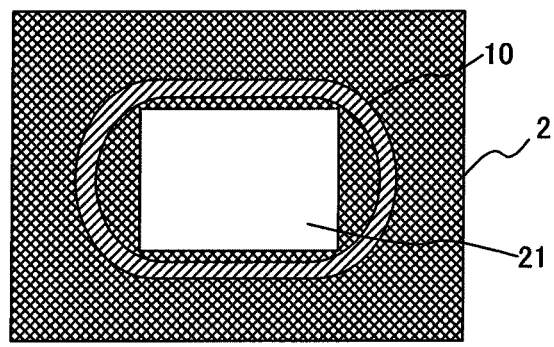
Figure 9E:
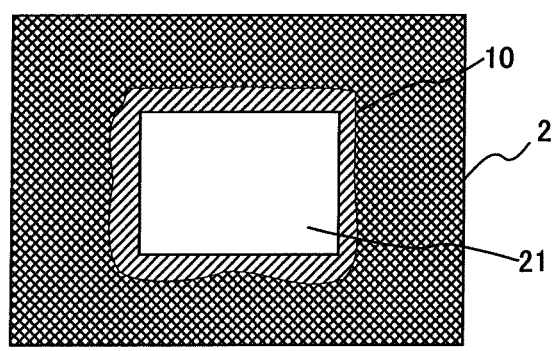

Alternatively, the configuration of conductive pattern 10 is not necessarily the same as the outline of the end surface of penetrating hole 21 (see FIG. 9D). Furthermore, the line width of conductive pattern 10 does not have to be uniform (see FIG. 9E).

Figure 9F:
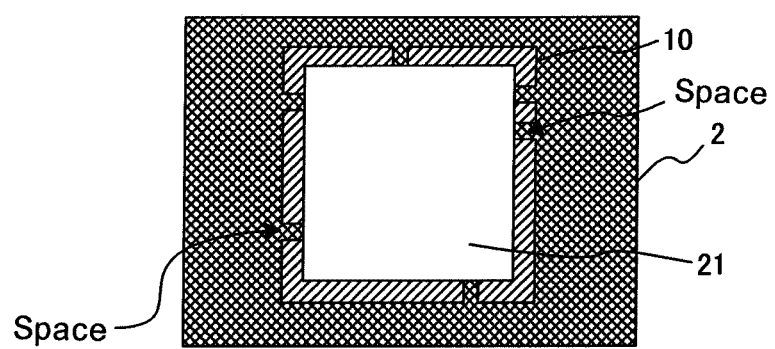

Also, in the above embodiment, conductive pattern 10 is formed to frame the end surface of penetrating hole 21 without leaving gaps in between. However, its configuration is not limited to such. For example, as shown in FIG. 9F, multiple fine spaces may exist. If conductive pattern 10 has such spaces as described, when forming interlayer insulation layer 6, there may be a risk that part of the resin material that has flowed into the gaps between electronic component 3 and the inner walls of core substrate 2 goes beyond the wall of conductive pattern 10 and flows onto the second surface of core substrate 2. However, the effect that tape 201 may easily be laminated substantially horizontally remains the same. In addition, by filling the spaces of conductive pattern 10 with the resin material, another effect will be expected that adherence between core substrate 2 and interlayer insulation layer 6 increases.

Figure 9G:
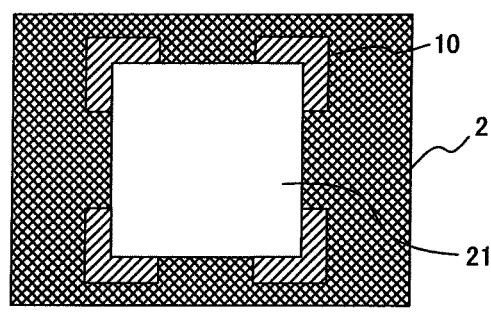
Figure 9H:
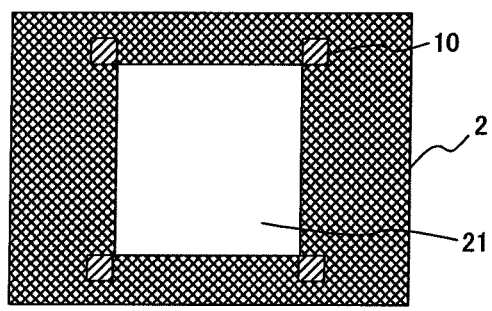
Figure 9I:
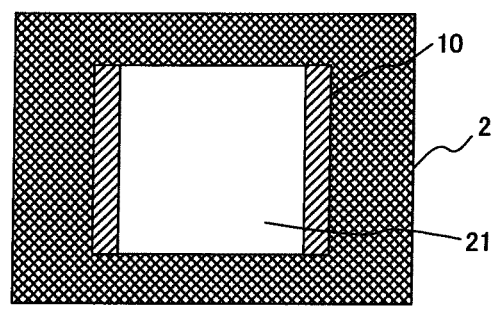

From the same view point as above, conductive pattern 10 does not necessarily have to be formed to frame the end surface of penetrating hole 21. For example, conductive pattern 10 may be formed in such configurations as shown in FIGS. 9G-9I. In short, as long as conductive pattern 10 is configured in such a way as to easily allow tape 201 to be laminated substantially horizontally, it is sufficient.

Figure 9J:
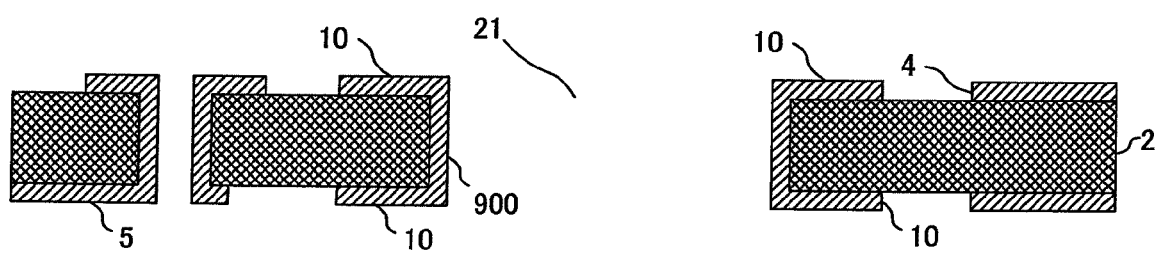

Also, conductive pattern 10 may be formed on both main surfaces of core substrate 2 instead of only on its one main surface. In FIG. 9J, an example is shown where conductive patterns 10 are formed on both main surfaces of core substrate 2, and copper-plated films 900 are formed on the side surfaces of penetrating hole 21 to connect both conductive patterns. As shown in FIG. 9J, if conductive patterns 10 and copper-plated films 900 are formed, a shielding effect may also be shown in addition to the above described effect.

Moreover, in the above embodiment, conductive pattern 10 was described as not electrically connected to other conductive patterns (namely, a dummy conductive pattern). However, conductive pattern 10 may be electrically connected to other conductive patterns to function as an electric circuit. Alternatively, the second conductive pattern may be used as a power source conductor or ground conductor.

Figure 10A:
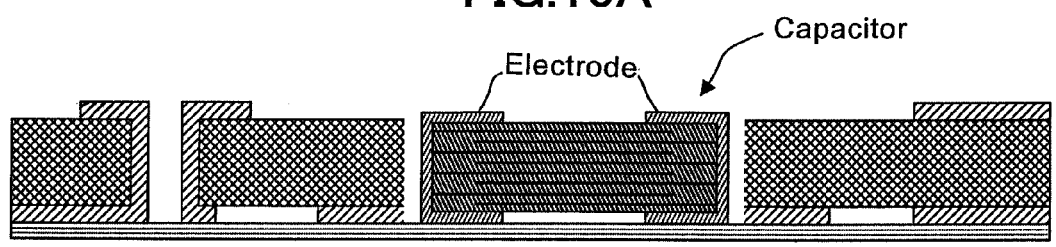
FIGS. 10A-10C are cross-sectional views showing an example in which an accommodated electronic component is a capacitor.
Figure 10B:
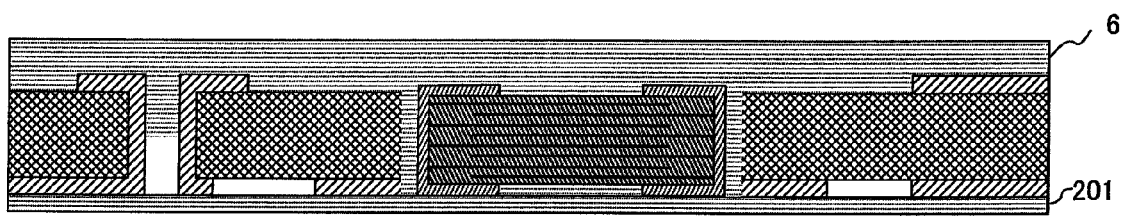
Figure 10C:
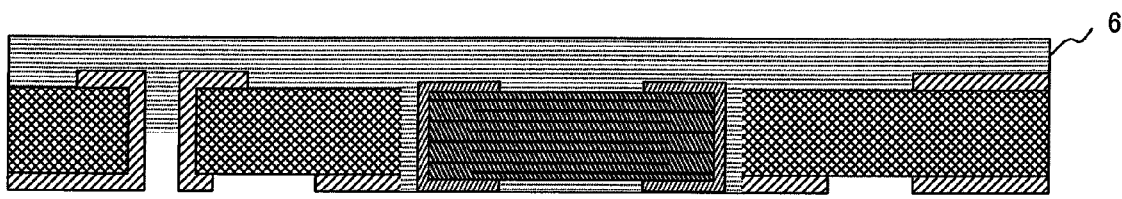

In addition, electronic component 3 accommodated in core substrate 2 is not limited to semiconductor elements such as an IC chip or the like. For example, as shown in FIGS. 10A-10C, a capacitor may be accommodated in core substrate 2 through the same process FIG. 2B-FIG. 3B as in the above embodiment.

Also, in the above embodiment, when forming interlayer insulation layer 6, the gaps between electronic component 3 and the inner walls of core substrate 2 are filled with the resin material forming interlayer insulation layer 6 to secure electronic component 3. However, electronic component 3 may be secured using other methods. For example, before forming interlayer insulation layer 6 (namely, before laminating a resin material), insulative resin (such as a resin made of thermosetting resin and inorganic filler) may be filled in the gaps between electronic component 3 and the inner walls of core substrate 2 to secure electronic component 3.

Furthermore, in the above embodiment, terminals 30 of electronic component 3 are connected through via conductors 60 to conductive pattern 8 on interlayer insulation layer 6. However, electronic component 3 is not limited to any mounting method; for example, electronic component 3 may be mounted using a wire bonding connection.

Figure 11A:
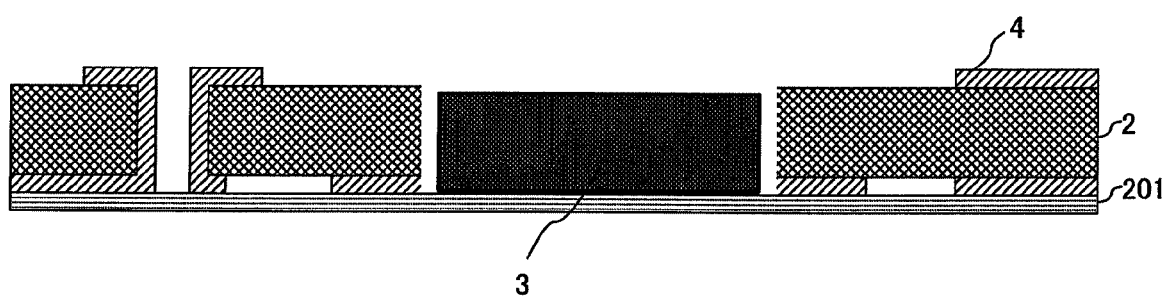
FIGS. 11A and 11B are cross-sectional views showing an example in which an electronic component is mounted through wire-bonding.

In the process of such a case, as shown in FIG. 11A, electronic component 3 is mounted in a face-up position on the connection (adhesive) surface of tape 201 on the substrate shown in FIG. 2A. On the top surface (the surface where circuits are formed) of electronic component 3, pads, not shown in the drawings, are arranged instead of connection terminals.

Figure 11B:
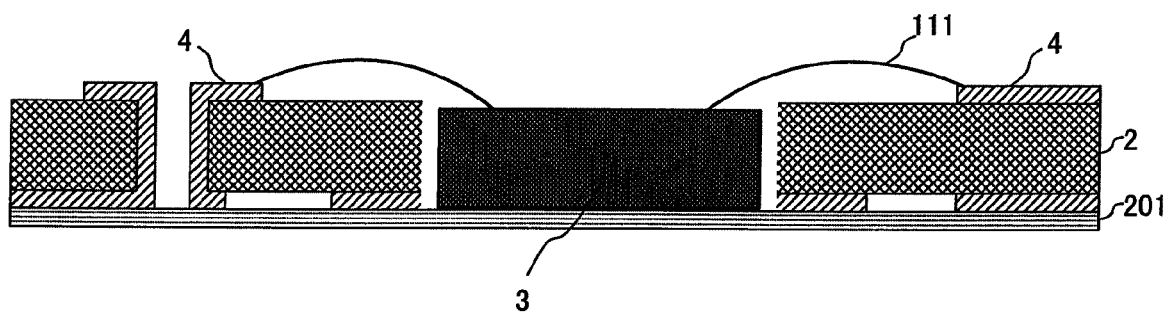

Then, as shown in FIG. 11B, pads of electronic component 3 and pads on core substrate 2 (here, parts of conductive pattern 4) are connected using wires 111 (fine wires made of gold or aluminum).

In such a case, since the flatness features of the top surface (where circuits are formed) of electronic component 3 are ensured as in the above embodiment, the accuracy of wire bonding connections is enhanced.

Figure 12A:
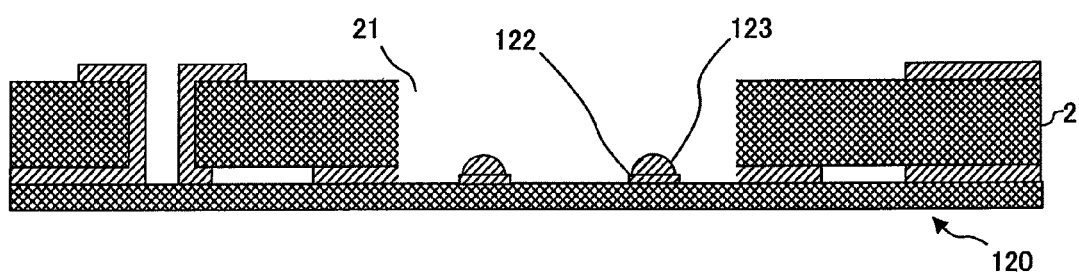
FIGS. 12A-12C are cross-sectional views showing an example in which an electronic component is flip-chip mounted.

Also, the present invention may be applied in a case in which electronic component 3 is flip-chip mounted. In the process in such a case, as shown in FIG. 12A, base material 120 instead of tape 201 is laminated on the second-surface side of the substrate shown in FIG. 1E. Base material 120 is formed with insulative material 121 such as prepreg or the like, pads 122 formed on insulative material 121 and solder bumps 123 formed on pads 122.

Figure 12B:
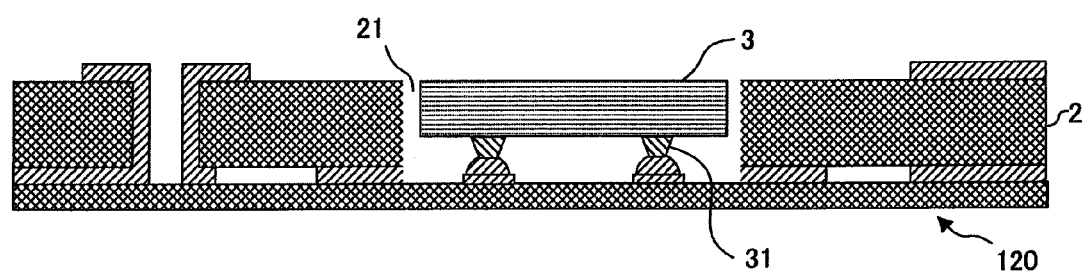
Figure 12C:
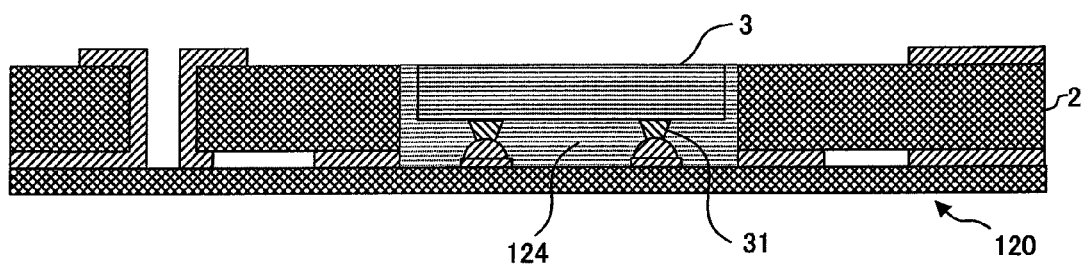
Figure 13A:
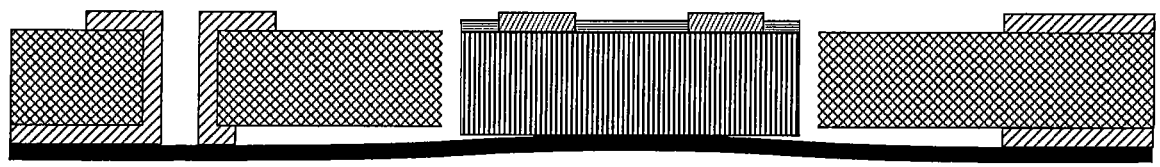
FIGS. 13A and 13B are cross-sectional views to illustrate conventional art.
Figure 13B:
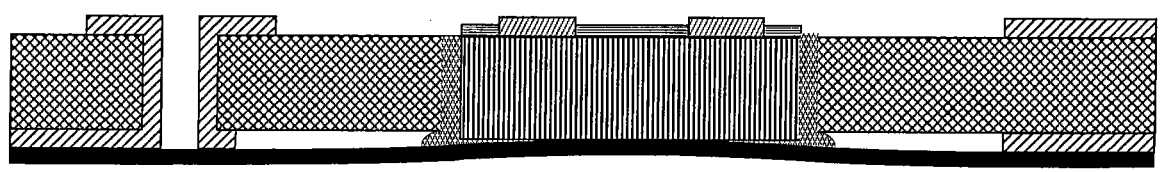

Then, as shown in FIG. 12B, electronic component 3 is mounted in a face-down position. Namely, electronic component 3 with bumps 31 is accommodated in penetrating hole 21 of the substrate shown in FIG. 12A and mounted on base material 120 with its surface where circuits are formed facing down. Bumps 31 of electronic component 3 are connected to solder bumps 123. Then, as shown in FIG. 12C, the gaps in penetrating hole 21 of core substrate 2 are filled with underfill material 124. Underfill material 124 is, for example, insulative resin containing inorganic filler such as silica or alumina. It ensures the strength to secure electronic component 3, while absorbing warping generated due to the gap in thermal expansion coefficients between electronic component 3 and core substrate 2.

As described, in a case where electronic component 3 is flip-chip mounted, electronic component 3 may also be mounted in a predetermined spot in penetrating hole 21 in a substantially horizontal manner.

Here, the conductive adhesive layers (not shown in the drawings) formed on pads 122 and bumps 31 of electronic component 3 may be electrically connected. The conductive adhesive layers are, for example, formed through tin plating, solder plating, or alloy plating such as tin-silver-copper plating.

A wiring board with a built-in electronic component according to one embodiment of the present invention includes a core substrate, an electronic component accommodated in a penetrating hole formed in the core substrate, a first conductive pattern formed on at least one main surface of the core substrate, a second conductive pattern formed on the same main surface as where the first conductive pattern is formed, and one or multiple interlayer insulation layers and conductive-pattern layers formed on the core substrate. Here, the second conductive pattern is formed on at least part of the periphery of an end surface of the penetrating hole.

A terminal of the electronic component may be electrically connected through a via conductor formed in any of the interlayer insulation layers to the conductive pattern formed on that interlayer insulation layer.

Alternatively, a terminal of the electronic component may be electrically connected to the conductive pattern formed on any of the interlayer insulation layers by means of a conductive bump or a conductive adhesive layer.

Alternatively, a pad of the electronic component may be electrically connected through a wire to another conductive pattern which is different from the first conductive pattern and the second conductive pattern formed on either one of the main surfaces of the core substrate.

On the periphery of an end surface of the penetrating hole, the second conductive pattern may be formed in parts facing each other across the penetrating hole.

The second conductive pattern may frame the periphery of an end surface of the penetrating hole.

The second conductive pattern may be in a continuous line to frame the periphery of an end surface of the penetrating hole.

Alternatively, the second conductive pattern may be in a broken line to frame the periphery of an end surface of the penetrating hole. In the parts between the discontinued lines, the surface of the core substrate may be exposed.

A side surface of the second conductive pattern may be formed on substantially the same level as the inner-wall surface of the core substrate where the penetrating hole is formed.

Alternatively, part of the second conductive pattern may protrude into the penetrating hole.

Alternatively, the second conductive pattern may maintain a predetermined space from the outline of an end surface of the penetrating hole.

The maximum width of the second conductive pattern may be made greater than the maximum width of the first conductive pattern.

The thickness of the second conductive pattern is preferred to be made substantially the same as the thickness of the first conductive pattern.

Resin is preferred to be filled in the gaps between the electronic component in the penetrating hole and the inner walls of the core substrate.

The electronic component is preferred to be accommodated in such a way that the surface of the electronic component where circuits are not formed faces the surface of the core substrate where the second conductive pattern is formed.

The second conductive pattern may be formed on both main surfaces of the core substrate.

A method for manufacturing a wiring board with a built-in electronic component according to another embodiment of the present invention includes the following: a step to form a penetrating hole to accommodate an electronic component in a core substrate; a step to form a first conductive pattern and a second conductive pattern on at least the same main surface of the core substrate; a step to laminate an adhesive tape on the surface of the core substrate where the first conductive pattern and the second conductive pattern are formed; a step to mount an electronic component on the adhesive surface of the adhesive tape at the bottom of the penetrating hole; a step to secure the electronic component by filling resin material in the gaps between the mounted electronic component and the inner walls of the core substrate; and a step to remove the adhesive tape after the electronic component is secured. Here, the second conductive pattern is formed on at least part of the periphery of an end surface of the penetrating hole.

Furthermore, the following steps may be added: a step to form an interlayer insulation layer and a conductive pattern on the electronic component and the core substrate; and a step to form in the insulation layer a via conductor which electrically connects a terminal of the electronic component and the conductive pattern.

On the periphery of an end surface of the penetrating hole, the second conductive pattern may be formed in parts facing each other across the penetrating hole.

The second conductive pattern may frame the periphery of an end surface of the penetrating hole.

The second conductive pattern may be in a continuous line to frame the periphery of an end surface of the penetrating hole.

Alternatively, the second conductive pattern may be in a broken line to frame the periphery of an end surface of the penetrating hole. In the parts between the discontinued lines, the surface of the core substrate may be exposed.

A side surface of the second conductive pattern may be formed on substantially the same level as the inner-wall surface of the core substrate where the penetrating hole is formed.

Alternatively, part of the second conductive pattern may be formed to protrude into the penetrating hole.

Alternatively, the second conductive pattern may maintain a predetermined space from the outline of an end surface of the penetrating hole.

The maximum width of the second conductive pattern may be made greater than the maximum width of the first conductive pattern.

Also, the adhesive tape is preferred to be a UV tape whose adhesiveness is reduced when ultraviolet rays are beamed.

Also, the thickness of the second conductive pattern is preferred to be made substantially the same as the thickness of the first conductive pattern.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a built-in electronic component, comprising:
   a core substrate having a penetrating hole formed in the core substrate;
   an electronic component accommodated in the penetrating hole in the core substrate, the electronic component having a surface;
   a conductive pattern layer formed on a first surface of the core substrate and including a first conductive pattern and a second conductive pattern, the conductive pattern layer having a surface;
   a through-hole conductor formed in the core substrate and electrically connected to the first conductive pattern; and
   an interlayer insulation layer formed over the surface of the conductive pattern layer, the surface of the electronic component, and the first surface of the core substrate,
   wherein the second conductive pattern is formed adjacent to a periphery of the penetrating hole, configured to frame the periphery of the penetrating hole, has substantially a same thickness as the first conductive pattern, and is configured to laminate, over the penetrating hole, a sheet for positioning the electronic component in the penetrating hole such that the surface of the electronic component and the surface of the conductive pattern layer are positioned on the sheet, the core substrate has a gap between the core substrate and the electronic component accommodated in the penetrating hole, and the gap is filled with a resin material.

2. The wiring board with a built-in electronic component according to claim 1, further comprising:
   an interlayer insulation layer formed over a second surface opposite to the first surface of the core substrate; and
   a conductive pattern formed over the interlayer insulation layer formed over the second surface of the core substrate,
   wherein the interlayer insulation layer formed over the second surface of the core substrate has a via conductor which electrically connects the conductive pattern over the second surface of the core substrate and a terminal of the electronic component.

3. The wiring board with a built-in electronic component according to claim 1, wherein the sheet comprises an adhesive tape.

4. The wiring board with a built-in electronic component according to claim 1, wherein the second conductive pattern comprises a plurality of portions facing each other across the penetrating hole.

5. The wiring board with a built-in electronic component according to claim 1, wherein the second conductive pattern is configured to frame the periphery of the penetrating hole in a continuous or broken line which has approximately a same width.

6. The wiring board with a built-in electronic component according to claim 1, wherein the second conductive pattern is configured to frame the periphery of the penetrating hole in a continuous line.

7. The wiring board with a built-in electronic component according to claim 1, wherein the second conductive pattern is configured to frame the periphery of the penetrating hole in a broken line.

8. The wiring board with a built-in electronic component according to claim 1, wherein a side surface of the second conductive pattern is formed on substantially the same level as the inner-wall surface of the core substrate where the penetrating hole is formed.

9. The wiring board with a built-in electronic component according to claim 1, wherein the second conductive pattern has a portion which protrudes into the penetrating hole.

10. The wiring board with a built-in electronic component according to claim 1, wherein the second conductive pattern is configured to maintain a space from an outline of the penetrating hole.

11. The wiring board with a built-in electronic component according to claim 1, wherein the second conductive pattern has a maximum width which is made greater than a maximum width of the first conductive pattern.

12. The wiring board with a built-in electronic component according to claim 1, further comprising an interlayer insulation layer formed over a second surface opposite to the first surface of the core substrate, wherein the interlayer insulation layer formed over the second surface of the core substrate comprises the resin material that fills the gap between the core substrate and the electronic component accommodated in the penetrating hole.

13. The wiring board with a built-in electronic component according to claim 1, wherein no circuits are formed on the surface of the electronic component.

14. The wiring board with a built-in electronic component according to claim 1, wherein the second conductive pattern is formed in a plurality, and the second conductive patterns are formed on the first surface and a second surface on an opposite side of the first surface of the core substrate, respectively.

15. The wiring board with a built-in electronic component according to claim 1, wherein the second conductive pattern is electrically disconnected from the first conductive pattern and the through-hole conductor.

16. The wiring board with a built-in electronic component according to claim 1, wherein the second conductive pattern is configured to laminate, over the penetrating hole, the sheet for positioning the electronic component in the penetrating hole such that the surface of the electronic component and the surface of the conductive pattern layer are positioned directly on the sheet.

* * * * *